United States Patent [19]

Toyonaga et al.

[11] Patent Number: 5,490,083
[45] Date of Patent: Feb. 6, 1996

[54] METHOD AND APPARATUS FOR CLASSIFYING AND EVALUATING LOGIC CIRCUIT

[75] Inventors: Masahiko Toyonaga, Hyogo; Michiaki Muraoka, Nara; Toshiro Akino, Osaka, all of Japan

[73] Assignee: Matsushita Electric Industrial Co., Ltd., Osaka, Japan

[21] Appl. No.: 130,385

[22] Filed: Oct. 1, 1993

[30] Foreign Application Priority Data

Oct. 5, 1992 [JP] Japan .................................. 4-265983

[51] Int. Cl.⁶ .................................................. G06F 17/50
[52] U.S. Cl. ........................ 364/489; 364/490; 364/491
[58] Field of Search .................................. 364/488, 489, 364/490, 491, 578

[56] References Cited

U.S. PATENT DOCUMENTS

| | | | |
|---|---|---|---|
| 4,408,134 | 10/1983 | Allen | 307/471 |
| 4,636,966 | 1/1987 | Yamada et al. | 364/491 |
| 4,823,278 | 4/1989 | Kikuchi et al. | 364/491 |
| 4,918,614 | 4/1990 | Modarres et al. | 364/490 |
| 4,961,156 | 10/1990 | Takasaki | 364/578 |

*Primary Examiner*—Kevin J. Teska
*Assistant Examiner*—Stephen J. Walder, Jr.
*Attorney, Agent, or Firm*—Willian Brinks Ho Gilson & Lione

[57] ABSTRACT

The logic elements and net list contained in a logic circuit are inputted to an electronic calculator. The total number N1 of primary adjacent logic circuits which are connected directly to all the logic elements contained in the foregoing logic circuit, respectively is calculated from the inputted logic elements and net list. The total number N2 of primary and secondary adjacent logic circuits, which is the sum of the foregoing total number N1 of primary adjacent logic circuits and the total number of secondary adjacent logic circuits which are connected directly to the primary adjacent logic circuits, respectively, is calculated from the inputted logic elements and net list. The difference between the logarithmic value of the foregoing total number N1 of primary adjacent logic circuits and the logarithmic value of the foregoing total number N2 of primary and secondary adjacent logic circuits is calculated as a value for classification which characterizes the aforesaid logic circuit.

10 Claims, 10 Drawing Sheets

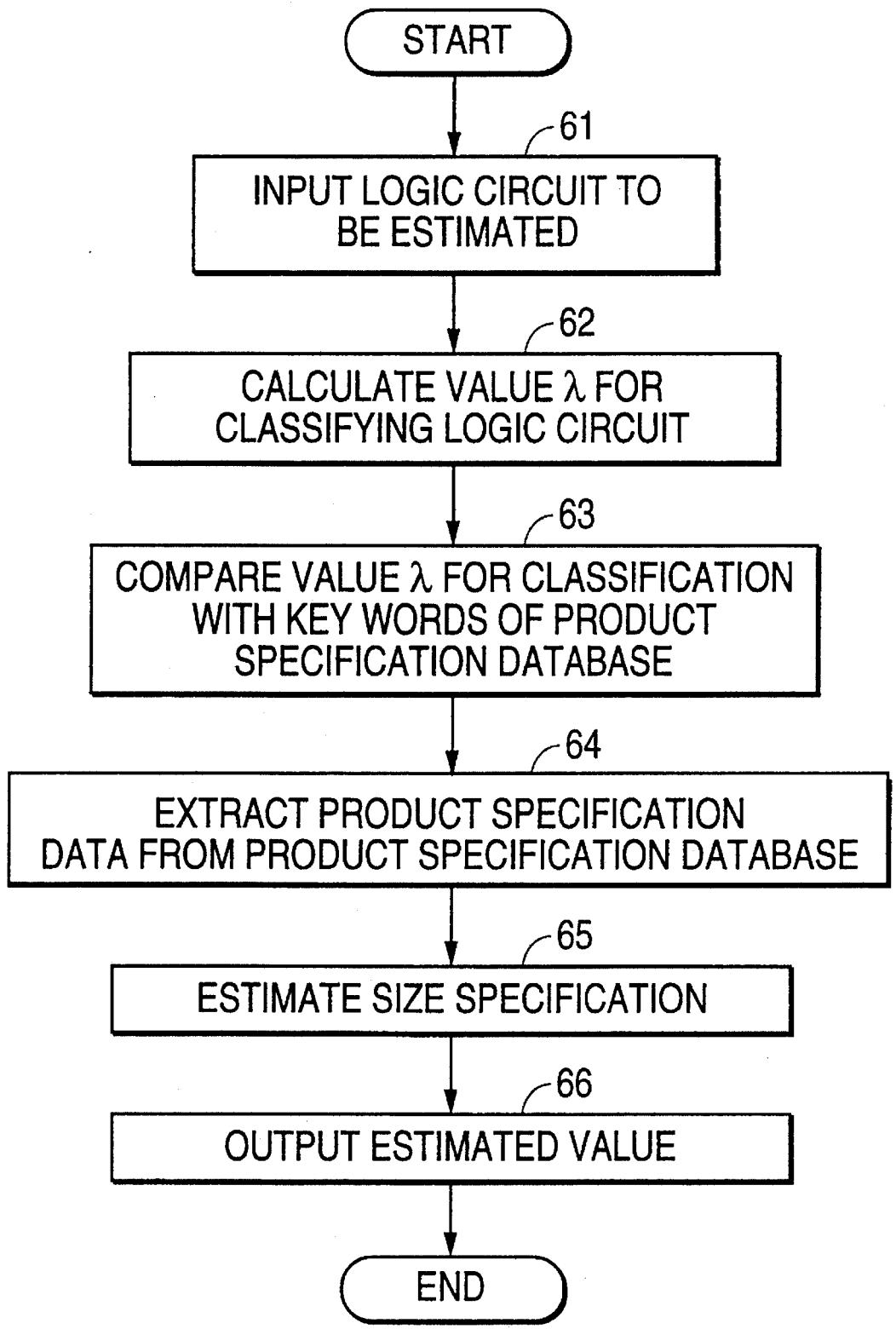

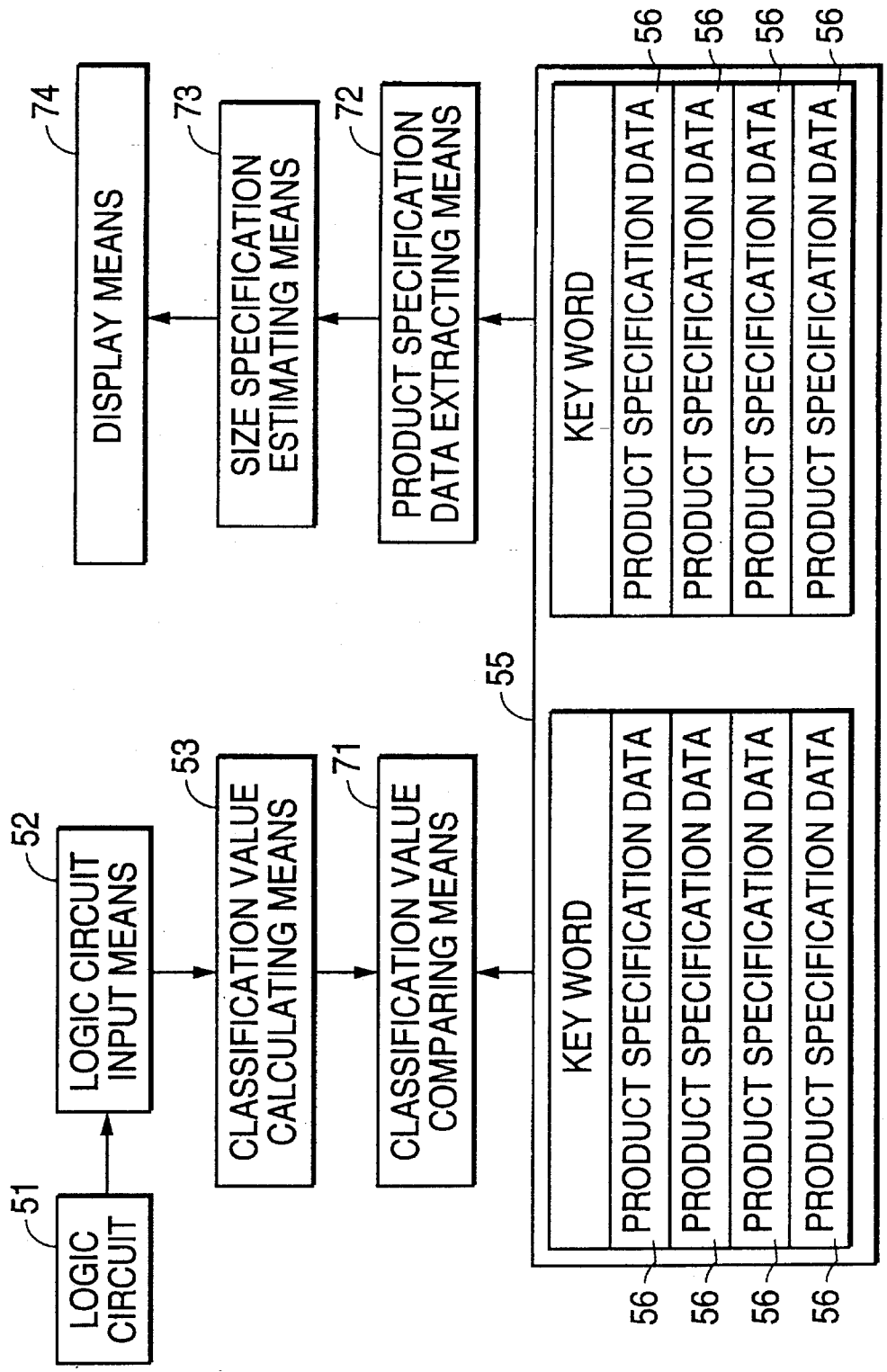

METHOD AND APPARATUS FOR CLASSIFYING AND EVALUATING LOGIC CIRCUIT

BACKGROUND OF THE INVENTION

The present invention relates to a method and apparatus for evaluating a logic circuit of an integrated circuit device such as a semiconductor substrate or printed-circuit board in a short period of time, to a method and apparatus for estimating the product specifications of the integrated circuit device, and to a CAD method and apparatus for assisting the layout design of the integrated circuit device. It particularly relates to a method and apparatus for properly classifying and evaluating a logic circuit, to a method and apparatus for creating a product specification database for an existing integrated circuit device, to a method and apparatus for estimating the product specifications of an integrated circuit to be manufactured, and to a method and apparatus for automatically organizing a logic circuit in a hierarchical structure so that the layout design of the integrated circuit device can be carried out at high speed.

In recent years, it has become possible to realize a large-scale integrated circuit on a single LSI chip or on a small number of printed-circuit boards due to the improvements in fabrication techniques, such as the multi-layer wiring technique and microprocessing, for producing integrated circuit device or printed-circuit boards.

As a larger-scale integrated circuit system has been realized on a LSI chip or on printed-circuit boards, design automation (DA) techniques for automating the layout design process of a logic circuit have been developed.

However, as the number of the logic elements to be designed becomes larger, the time required by an electronic calculator for processing has become extremely long with a conventional method and apparatus. Moreover, the deterioration in quality of the result of the automatic processing has been causing problems.

In general, the operational specification is identified by using an estimated wire length (wire length calculated in terms of the circuit scale based on statistics). However, in the case where the estimated wire length differs greatly from the real wire length in the final product, it is required to design or lay out the logic circuit again, which results in a waste of labor.

To prevent such a disadvantage, there is a case where a logic circuit is designed by using a redundant estimated wire length in consideration of the dispersion in value of the estimated wire length. However, this necessitates the provision of a signal output device for outputting a signal to the redundant lines, resulting in the increase in layout area and fabrication cost.

The layout area of an LSI is generally calculated on the basis of a value obtained by multiplying the total element area by a constant. However, the obtained layout area and hence fabrication cost of the LSI present values with errors which are often twice as large as the real values or more.

In addition, if a long-term designing operation is repeatedly performed with the above-mentioned DA techniques, the period and cost required for the development of the LSI are disadvantageously increased.

In view of these circumstances, there has been a demand for the establishment of a method which uses existing design data, logic circuits, and their layouts as product specifications so as to reduce the designing period, to compensate for the ambiguous estimation, to estimate product specifications with high precision prior to the layout design, and to perform the overall DA process at high speed. Specifically, there has been a demand for the following techniques:

(1) a technique of reusing existing logic circuits (design assets) efficiently;

(2) a technique of estimating with high precision the product specifications of an integrated circuit device to be manufactured; and (3) a technique of performing the DA process at high speed by organizing a logic circuit in a hierarchical structure.

For the efficient utilization of existing logic circuits, it is necessary to classify the existing logic circuits. It is also necessary to create a product specification database based on the method of classification.

With conventional techniques, logic circuits are mostly classified in terms of their functions. As a method to store data on a logic circuit, accordingly, a product specification database is created in terms of individual functions.

However, even with logic circuit blocks having similar functions, their structures differ greatly depending on the processing speed, layout area, and power consumption. Therefore, it is necessary to establish a method of calculating a value for classification in view of the present circumstances and a method of creating a product specification database on the basis of the value for classification.

The effect of the hierarchical organization of logic circuit elements on the processing speed can be estimated as follows. Suppose that the processing time T with a specific technique for dividing a logic circuit is the square of the number N of their logic elements, i.e., T is proportional to $N^2$. If the logic elements are hierarchically organized so that N becomes N/2, the processing time required to organize the logic elements in a hierarchical structure is proportional to $(N/2)^2$, as expressed in the following equation (1). Consequently, the processing time is reduced to a forth of the original time by halving the elements.

$$T'=T/4 \tag{1}$$

However, the result of the process of hierarchical organization normally deteriorates in quality, as indicated in a book (Sivanarayana Mallela and Lov K. Grover, "Clustering based Simulated Annealing for Standard Cell Placement," 25-th ACM/IEEE Design Automation Conference, pp. 312–317, 1988). In the book mentioned above, the deterioration in quality of the processing result in generating clusters (a type of hierarchy) is prevented by limiting the magnitude of a cluster with a given constant.

However, the optimum magnitude of a cluster in hierarchical organization varies depending on the type and property of a logic circuit. Accordingly, it becomes necessary to establish a method of hierarchical organization which can determine the magnitude of a cluster by considering the characteristics of a logic circuit. For this purpose also, it is required to calculate the value for classification that reflects the characteristics of a logic circuit.

From the foregoing description, it will be understood that the most important technique in establishing the above-mentioned method is of calculating the value for classifying a logic circuit.

Some conventional techniques for classifying and evaluating a logic circuit utilize as the value for classification a relatively large logic function, called a functional block, of the logic circuit, while others utilize a ratio of the number of logic elements to the number of lines (hereinafter referred to as net number) as the value for classification.

However, since there are a variety of logic circuits which have the same number of elements and the same number of lines, it is impossible to establish a specific relationship between the layout and the ratio of the number of elements to the number of lines. In principle, it is difficult to obtain, from the number of elements and lines thereof, the classification value for use in estimating the layout design of a logic circuit. This is because the layout design is physically or spatially restricted in that it is definitely two dimensional, while the design of a logic circuit has no physical or spatial limitations.

Hence, it will be understood that, if the physical or spatial range of a logic circuit is utilized as the value for classification, it can serve as an indicator in estimating the relationship between the design of the logic circuit and the layout design thereof.

Among the methods utilizing the physical or spatial range of a logic circuit as the value for classification, there is a method which utilizes the numerical relationship between a logic circuit and its layout as the value for classifying the logic circuit by its logic function, for the layout area varies greatly depending on the function of the logic circuit. There is also another method which utilizes the relationship between the number of elements and the net number as the value for classification, for the result of the layout reflects such factors as element area, element number, and net number.

In the case where logic function is utilized as the value for classifying a logic circuit, it is classified in terms of its logic function such as an adder, multiplier, and data path. If a synthesized system is introduced based on the logic function in designing the logic circuit, various logic circuits having the same logic function may result, depending on control factors such as a high-speed operation and minimized area, in a process of automatically connecting specific logic elements based on the design concept of the logic circuit to be realized. Thus, the utilization of a logic function as the reference for classifying a logic circuit is disadvantageous in that the individual characteristics of logic circuits are not reflected in their calculated values for classification.

Consequently, it becomes impossible to estimate product specifications of a logic circuit. To satisfy the functional specification and cost specification of a product, it becomes necessary to repeatedly perform the designing operation with the DA techniques over a long period of time, resulting in an increase in period and cost for the development of an LSI. It is known that the number of elements in a logic circuit differs depending on the system adopted. For example, the number of elements in a logic circuit serving as a 4-bit adder may double depending on whether it adopts the carry look ahead system or ripple carry system. This exemplifies the difficulty in precisely estimating the product specifications of the logic circuit when the value for classification is determined by its logic function.

Also in the method utilizing the ratio of net number to number of elements as the value for classifying a logic circuit, there is a case where the properties of logic circuits, such as the ranges of their lines, are different even with circuits having the same ratio of net number to number of elements. Logic circuits shown in FIGS. 10(a), 10(b), and 10(c) exemplify the case. Each of the logic circuits of FIG. 10(a) and FIG. 10(b) presents Net Number/Element Number=2, which shows that the logic circuits have the same classification value in common.

However, the net list of the logic circuit of the FIG. 10(b) indicates a one-dimensional connection, so that the logic circuit of FIG. 10(b) is less similar than to the logic circuit of FIG. 10(a) than it is to the logic circuit of FIG. 10(c) which has Net Number/Element Number=1 as the value for classification. This proves that the characteristics of a logic circuit are not precisely reflected in the classification value calculated from the ratio of net number to number of elements.

As described above, the classification value calculated from the ratio of net number to number of elements, which has conventionally been used, is disadvantageous as a reliable indicator in classification.

SUMMARY OF THE INVENTION

An object of the present invention is to provide a method and apparatus for obtaining a value for classification, which characterizes the net list of a logic circuit, from the geometric relations in the logic circuit.

A method of classifying and evaluating a logic circuit by means of an electronic calculator based on a value for classification which characterizes said logic circuit, said value for classification being calculated from the logic elements and net list contained in the logic circuit, according to the present invention comprises the steps of: inputting to an electronic calculator the logic elements and net list contained in-the logic circuit; calculating, from the inputted logic elements and net list, the total number of primary adjacent logic elements that are connected directly to all the logic elements contained in said logic circuit, respectively; calculating, from the inputted logic elements and net list, the total number of primary and secondary adjacent logic elements, which is the sum of said total number of primary adjacent logic elements and the total number of secondary adjacent logic elements that are connected directly to said primary adjacent logic elements, respectively and calculating, as said value for classification which characterizes said logic circuit, the difference between the logarithmic value of said total number of primary adjacent logic elements and the logarithmic value of said total number of primary and secondary adjacent logic elements.

In the method of classifying and evaluating a logic circuit, said step of calculating the total number of primary adjacent logic elements further comprises the steps of: individually calculating the number of primary adjacent logic elements that are connected directly to a logic element via lines contained in said logic circuit; and repeating the preceding step for each of the logic elements contained in said logic circuit and obtaining the total number of primary adjacent logic elements of all the logic elements, and said step of calculating the total number of primary and secondary adjacent logic elements further comprises the steps of: individually calculating the number of secondary adjacent logic elements that are connected directly to a primary adjacent logic element via lines; and repeating the preceding step for each of the primary adjacent logic elements contained in said logic circuit and obtaining the total number of secondary adjacent logic elements of all the primary adjacent logic elements, so as to obtain the sum of the total number of primary adjacent logic elements of all the logic elements and the total number of secondary adjacent logic elements of all the primary adjacent logic elements.

An apparatus for classifying and evaluating a logic circuit by means of an electronic calculator based on a value for classification which characterizes said logic circuit, said value for classification being calculated from the logic elements and net list contained in the logic circuit, according to the present invention comprises: means for inputting to an electronic calculator the logic elements and net list contained in the logic circuit; means for calculating, from the inputted logic elements and net list, the total number of primary adjacent logic elements that are connected directly to all the logic elements contained in said logic circuit, respectively; means for calculating, from the inputted logic elements and net list, the total number of primary and secondary adjacent logic elements, which is the sum of said total number of primary adjacent logic elements and the total number of secondary adjacent logic elements that are connected directly to said primary adjacent logic elements, respectively; and means for calculating, as said value for classification which characterizes said logic circuit, the difference between the logarithmic value of said total number of primary adjacent logic elements and the logarithmic value of said total number of primary and secondary adjacent logic elements.

The above method and apparatus for classifying and evaluating a logic circuit utilize, as the value for classification, the difference $\lambda$ between the logarithmic value of the total number N1 of primary adjacent elements which are connected directly to the logic elements contained in the logic circuit via lines and the logarithmic value of the total number N2, which is the sum of the total number N1 of primary adjacent elements and the total number of secondary adjacent elements which are connected directly to the primary adjacent elements via lines.

Below, the above value $\lambda$ for classification will be described in detail.

In general, a method using a value called "geometric fractal dimension d" is known to characterize a complicated geometry. The method is shown, for example, in "Introduction to Fractal Mathematics" published by Baifukan. Below, the method shown in "Introduction to Fractal Mathematics" will be described briefly.

If a geometric figure on the subject can be covered up with cells (e.g., circular cells with a diameter r or square cells with a side r), that is, if the geometric figure on the subject can be covered up with n cells (n is a positive integer), the relations among d, r, and n are given by the following equation (2).

$$n = N/r^d \quad (2)$$

Here, N denotes the total number of cells when the geometric figure is covered up with the cells having the length r=1. If written in a logarithmic expression, the equation (2) gives the following equation (3).

$$\begin{aligned} \log(n) &= \log(N/r^d), \\ &= \log(N) - \log(r^d), \\ &= \log(N) - d * \log(r) \end{aligned} \quad (3)$$

The equation (3) is rewritten for d to give the following equation (4).

$$d = \{\log(N) - \log(n)\}/\log(r) \quad (4)$$

By simple trial, d =2 is obtained with a geometric figure of a simple two-dimensional structure and d=3 is obtained with a geometric figure of a simple three-dimensional structure.

According to the fractal theory, a geometric figure having the property that d becomes a constant even when r is varied is defined as fractal. If the fractal dimension d of a certain geometric figure is unknown, it can be calculated as follows.

Suppose the geometric figure is covered with two types of cells having the lengths r1 and r2, respectively. If the respective total numbers of the two types of cells are n1 and n2, the following equations (5) and (6) are obtained from the equation (4).

$$d = \{\log(N) - \log(n1)\}/\log(r1) \quad (5)$$

$$d = \{\log(N) - \log(n2)\}/\log(r2) \quad (6)$$

If the ratio of r1 to r2 is 1:2, as expressed in the following equation (7), the following equations (8) and (9) are obtained from the equations (5), (6), and (7).

$$r2 = 2*r1 \quad (7)$$

$$\log(r1)*d = \{\log(N) - \log(n1)\} \quad (8)$$

$$\log(2*r1)*d = \{\log(N) - \log(n2)\},$$

$$\{\log(2) + \log(r1)\}*d\{\log(N) - \log(n2)\} \quad (9)$$

By subtracting the equation (8) from the equation (9) so as to eliminate the terms r1 and N, the total numbers n1 and n2 covering the geometric figure give the following equation (10), which determines d.

$$\begin{aligned} \log(2) * d &= \log(n1) - \log(n2), \\ d &= \{\log(n1) - \log(n2)\}/\log(2) \end{aligned} \quad (10)$$

According to the present invention, it is considered that the lines connecting the logic elements in a logic circuit determine the spatial or positional relationship between the logic elements, and hence it is defined that the total number N1 of primary adjacent elements represents the positional relationship when r=1 and that the total number N2 of primary and secondary adjacent elements represents the positional relationship when r=2. Namely, N1 is defined as the total number of elements covered by all the cells having the length r1 and N2 is defined as the total number of elements covered by all the cells having the length r2. If the total number of elements is NA, the mean number of elements covered by a cell having the length r1 is N1/NA. When the elements are covered by the cells having the length r1, therefore, the total number n1 of cells is given by dividing the total number of elements by the mean number N1/NA of the elements covered by a cell having the length r1, as expressed in the following equation (11).

$$\begin{aligned} n1 &= NA/(N1/NA), \\ &= NA^2/N1 \end{aligned} \quad (11)$$

Similarly, since the total number N2 of primary and secondary adjacent elements indicates the number of cells covered by all the cells having the length r2, the total number n2 of cells when the elements are covered by the cells having the length r2 is given by the following equation (12).

$$n2 = NA^2/N2 \quad (12)$$

If the equation (10) is substituted in the equation (10), the following equation (13) is obtained.

$$\begin{aligned} d &= \{\log(n1) - \log(n2)\}/\log(2), \\ &= \{\log(NA^2/N1) - \log(NA^2/N2)\}/\log(2), \\ &= \{\log(N2) - \log(N1)\}/\log(2) \end{aligned} \quad (13)$$

With N1 and N2, the value $\lambda$ for classifying a logic circuit of the present invention is given by the following equation (14).

$$\lambda = \log(N2) - \log(N1) \quad (14)$$

Considering that log(2) is a constant, it will be understood that the value $\lambda$ for classifying a logic circuit according to the present invention is the same in quality as the fractal dimension which is reliable as a value for classifying the properties of geometric figures. Hence, by using the value λ for classifying a logic circuit according to the present invention, it becomes possible to discern complicated geometries of logic circuits in essence.

Since the method and apparatus for classifying and evaluating a logic circuit of the present invention use the value which is the same in quality as the fractal dimension used as a value for classifying geometric properties in the fractal theory which is established as a theory for classifying geometric properties, it becomes possible to discern complicated geometries of logic circuits in essence, so that the positional relationship between the logic elements and net list in a complicated logic circuit can be reflected in the classification thereof. Consequently, with the method of claim 1 according to the present invention, it is possible to classify functional blocks having the same logic function in terms of their properties and to properly classify logic circuits which have the same net number or number of lines.

Another object of the present invention is to provide a method and apparatus for creating a product specification database for existing integrated circuit devices which have been classified based on the value for classification that was calculated with the method and apparatus mentioned above.

A method of creating a product specification database for an existing integrated circuit device by means of an electronic calculator based on a value for classification which characterizes the logic circuit of the existing integrated circuit device, said value for classification being calculated from the logic elements and net list contained in the logic circuit of the existing integrated circuit device, according to the present invention comprises the steps of: inputting to an electronic calculator the logic elements and net list contained in the logic circuit of the existing integrated circuit device; calculating, from the inputted logic elements and net list, the total number of primary adjacent logic elements that are connected directly to all the logic elements contained in said logic circuit, respectively; calculating, from the inputted logic elements and net list, the total number of primary and secondary adjacent logic elements, which is the sum of said total number of primary adjacent logic elements and the total number of secondary adjacent logic elements that are connected directly to the primary adjacent logic elements, respectively; calculating, as said value for classification which characterizes said logic circuit, the difference between the logarithmic value of said total number of primary adjacent logic elements and the logarithmic value of said total number of primary and secondary adjacent logic elements; and creating a product specification database in which product specification of said existing integrated circuit device is classified by using, as a key word, the obtained value for classification.

An apparatus for creating a product specification database for an existing integrated circuit device by means of an electronic calculator based on a value for classification which characterizes the logic circuit of the existing integrated circuit device, said value for classification being calculated from the logic elements and net list contained in the logic circuit of the existing integrated circuit device, according to the present invention comprises: means for inputting to an electronic calculator the logic elements and net list contained in the logic circuit of the existing integrated circuit device; means for calculating, from the inputted logic elements and net list, the total number of primary adjacent logic elements that are connected directly to all the logic elements contained in said logic circuit, respectively; means for calculating, from the inputted logic elements and net list, the total number of primary and secondary adjacent logic elements, which is the sum of said total number of primary adjacent logic elements and the total number of secondary adjacent logic elements that are directly connected to the primary adjacent logic elements, respectively; means for calculating, as said value for classification which characterizes said logic circuit, the difference between the logarithmic value of said total number of primary adjacent logic elements and the logarithmic value of said total number of primary and secondary adjacent logic elements; and means for creating a product specification database in which product specification of said existing integrated circuit device is classified by using, as a key word, the obtained value for classification.

According to the method and apparatus for creating a product specification database of the present invention, production specification data is classified by using the value for classification which is the same in quality as the fractal dimension described above, so that it becomes possible to create the product specification database on the basis of the classification which reflects the logic elements and net list in an ordinary logic circuit.

Still another object of the present invention is to provide a method and apparatus for estimating the product specifications of an integrated circuit device to be manufactured by utilizing the product specification database of existing integrated circuit devices mentioned above and by using the value for classification obtained from the geometric relations mentioned above.

A method of estimating the product specifications of an integrated circuit device to be manufactured by means of an electronic calculator based on a value for classification which characterizes the logic circuit of the integrated circuit device to be manufactured, said value for classification being calculated from the logic elements and net list contained in the logic circuit of the existing integrated circuit device, according to the present invention comprises the steps of: inputting to an electronic calculator the logic elements and net list contained in the logic circuit of the integrated circuit device to be manufactured; calculating, from the inputted logic elements and net list, the total number of primary adjacent logic elements that are connected directly to all the logic elements contained in said logic circuit, respectively; calculating, from the inputted logic elements and net list, the total number of primary and secondary adjacent logic elements, which is the sum of said total number of primary adjacent logic elements and the total number of secondary adjacent logic elements that are connected directly to the primary adjacent logic elements, respectively; calculating, as said value for classification which characterizes said logic circuit, the difference between the logarithmic value of said total number of primary adjacent logic elements and the logarithmic value of said total number of primary and secondary adjacent logic elements; extracting, from the product specification database for existing integrated circuit devices which was created according to the method of creating a product specification database of claim 3, the product specifications of an existing integrated circuit device that has the value for classification equal to the obtained value for classifying the integrated circuit device to be manufactured; and estimating the product specifications of the integrated circuit device to be manufactured on the basis of the extracted product specifications of the existing integrated circuit device; and outputting the estimated product specifications of the integrated circuit device to be manufactured.

An apparatus for estimating the product specifications of an integrated circuit device to be manufactured by means of an electronic calculator based on a value for classification which characterizes the logic circuit of the integrated circuit device to be manufactured, said value for classification being calculated from the logic elements and net list contained in the logic circuit of the existing integrated circuit device, according to the present invention comprises: means for inputting to an electronic calculator the logic elements and net list contained in the logic circuit of the integrated circuit device to be manufactured; means for calculating, from the inputted logic elements and net list, the total number of primary adjacent logic elements that are connected directly to all the logic elements contained in said logic circuit, respectively; means for calculating, from the inputted logic elements and net list, the total number of primary and secondary adjacent logic elements, which is the sum of said total number of primary adjacent logic elements and the total number of secondary adjacent logic elements that are connected directly to the primary adjacent logic elements, respectively; means for calculating, as said value for classification which characterizes said logic circuit, the difference between the logarithmic value of said total number of primary adjacent logic elements and the logarithmic value of said total number of primary and secondary adjacent logic elements; means for extracting, from the product specification database for existing integrated circuit devices which was created according to the method of creating a product specification database of claim 3, the product specifications of an existing integrated circuit device that has the value for classification equal to the obtained value for classifying the integrated circuit device to be manufactured; and means for estimating the product specifications of the integrated circuit device to be manufactured on the basis of the extracted product specifications of the existing integrated circuit device; and means for outputting the estimated product specifications of the integrated circuit device to be manufactured.

According to the method and apparatus for estimating product specifications, the logic circuit of an integrated circuit device to be manufactured is classified by using the value for classification which is the same in quality as the fractal dimension described above and the product specification data having the equal value for classification is extracted from among the sets of product specification data on existing integrated circuit devices which have been classified in the product specification database by using, as key words, their values for classification. Consequently, the logic circuit of the integrated circuit device to be manufactured can be estimated with high precision.

Still another object of the present invention is to provide a method and apparatus for hierarchically organizing a logic circuit without deteriorating the quality of CAD processing by calculating the value for classifying the logic circuit based on the geometric relations thereof and by similarly calculating the value for classifying the resulting logic circuit which has been hierarchically organized so as to compare the both values for classification.

A method of automatically organizing a logic circuit in a hierarchical structure to create a hierarchical logic circuit by means of an electronic calculator based on the logic elements and net list contained in the logic circuit, according to the present invention comprises the steps of: (a) inputting to an electronic calculator the logic elements and net list contained in the logic circuit; (b) calculating, from the inputted logic elements and net list, the total number of primary adjacent logic elements that are connected directly to all the logic elements contained in said logic circuit, respectively; (c) calculating, from the inputted logic elements and net list, the total number of primary and secondary adjacent logic elements, which is the sum of said total number of primary adjacent logic elements and the total number of secondary adjacent logic elements that are connected directly to the primary adjacent logic elements, respectively; (d) calculating, as a first value for classification that characterizes said logic circuit, the difference between the logarithmic value of said total number of primary adjacent logic elements and the logarithmic value of said total number of primary and secondary adjacent logic elements; (e) creating a hierarchical logic circuit by subjecting said logic circuit to a process of hierarchical organization; (f) calculating, from the inputted hierarchical logic elements and net list contained in said hierarchical logic circuit, the total number of primary adjacent logic elements that are connected directly to all the logic elements contained in said hierarchical logic circuit, respectively; (g) calculating, from the inputted hierarchical logic elements and net list contained in said hierarchical logic circuit, the total number of primary and secondary adjacent logic elements, which is the sum of said total number of said primary adjacent logic elements and the total number of secondary adjacent logic elements that are connected directly to all the primary adjacent logic elements, respectively; (h) calculating, as a second value for classification that characterizes said hierarchical logic circuit, the difference between the logarithmic value of said total number of primary adjacent logic elements and the logarithmic value of said total number of primary and secondary adjacent logic elements; (i) judging whether the difference between said first value for classification and said second value for classification has reached a specified permissible value or not and completing the process of hierarchical organization if it is judged that the difference between said first value for classification and said second value for classification has reached the specified permissible value or creating a high-level hierarchical logic circuit by further subjecting said hierarchical logic circuit to the process of hierarchical organization if it is judged that the difference between said first value for classification and said second value for classification has not reached the specified permissible value; and (j) repeating the processes of said preceding steps (f), (g), (h), and (i).

An apparatus for automatically organizing a logic circuit in a hierarchical structure to create a hierarchical logic circuit by means of an electronic calculator based on the logic elements and net list contained in the logic circuit, according to the present invention comprises: means for inputting to an electronic calculator the logic elements and net list contained in the logic circuit; means for calculating, from the inputted logic elements and net list, the total number of primary adjacent logic elements that are connected directly to all the logic elements contained in said logic circuit, respectively; means for calculating, from the inputted logic elements and net list, the total number of primary and secondary adjacent logic elements, which is the sum of said total number of primary adjacent logic elements and the total number of secondary adjacent logic elements that are connected directly to the primary adjacent logic elements, respectively; means for calculating, as a first value for classification that characterizes said logic circuit, the difference between the logarithmic value of said total number of primary adjacent logic elements and the logarithmic value of said total number of primary and secondary adjacent logic elements; means for creating a hierarchical logic circuit by subjecting said logic circuit to a process of hierarchical organization; means for calculating, from the hierarchical logic elements and net list contained in said hierarchical logic circuit, the total number of primary adjacent logic elements that are connected directly to all the logic elements contained in said hierarchical logic circuit, respectively; means for calculating, from the inputted hierarchical logic elements and net list contained in said hierarchical logic circuit, the total number of primary and secondary adjacent logic elements, which is the sum of said total number of said primary adjacent logic elements and the total number of secondary adjacent logic elements that are connected directly to all the primary adjacent logic elements, respectively; means for calculating, as a second value for classification that characterizes said hierarchical logic circuit, the difference between the logarithmic value of said total number of primary adjacent logic elements and the logarithmic value of said total number of primary and secondary adjacent logic elements; means for judging whether the difference between said first value for classification and said second value for classification has reached a specified permissible value or not; and means for creating a high-level hierarchical logic circuit by further subjecting said hierarchical logic circuit to the process of hierarchical organization.

According to the method and apparatus for automatically organizing a logic circuit in a hierarchical structure, a high-level hierarchical logic circuit can automatically be created without altering the fractal property of the logic circuit, so that the property of the original logic circuit can be reflected in any CAD processing. Consequently, the hierarchical organization of the logic circuit which enables high-speed CAD processing can be accomplished without deteriorating the quality of the resultant hierarchical logic circuit, thereby reducing the time required by CAD for processing an extremely large logic circuit.

BRIEF DESCRIPTION OF THE DRAWINGS

FIG. 7 is a view showing the flow of a process of estimating product specifications according to a third embodiment of the present invention;

FIG. 8 is a view showing the structure of an apparatus for estimating product specifications according to the third embodiment of the present invention;

DETAILED DESCRIPTION OF THE PREFERRED EMBODIMENTS

EXAMPLE 1

Below, a method of classifying a logic circuit will be described as a first embodiment of the present invention.

Figure 1:
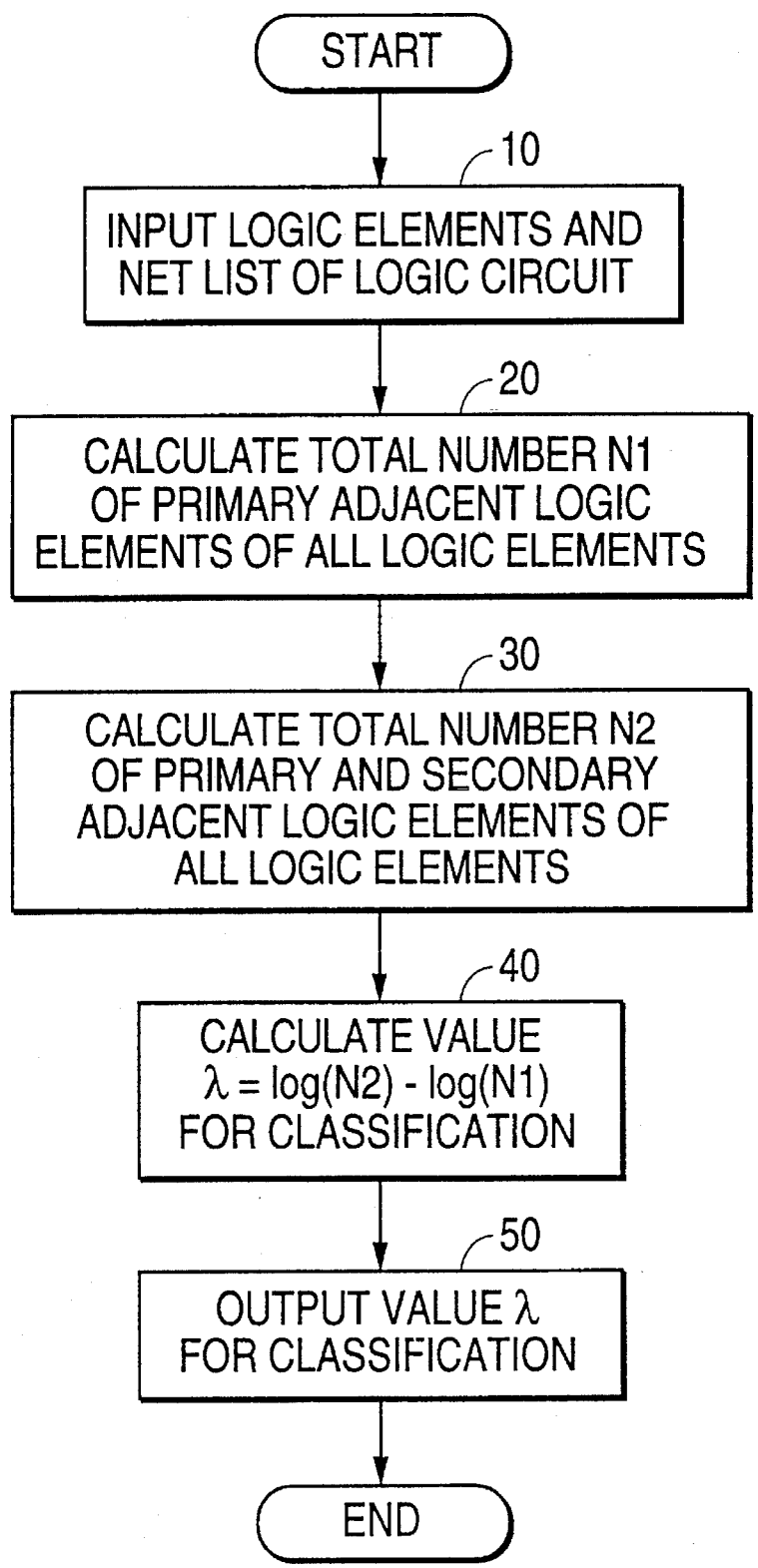
FIG. 1 is a view showing the flow of a process in a method of classifying and evaluating a logic circuit according to a first embodiment of the present invention.
Figure 10A:
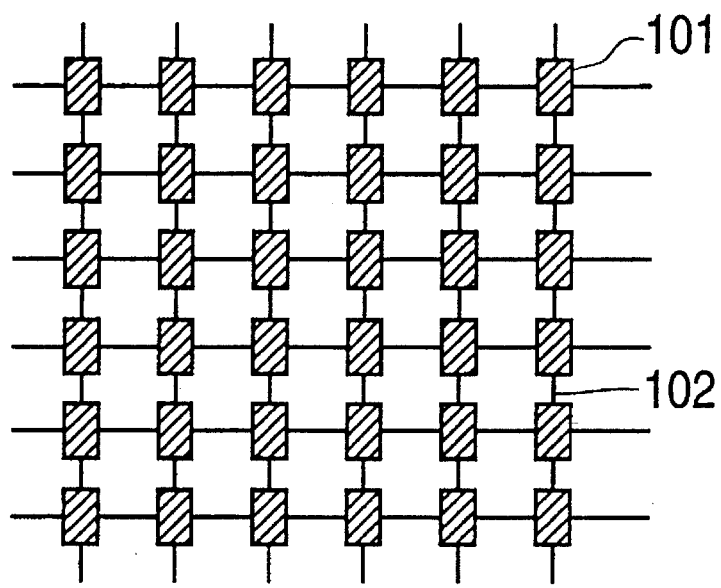
FIGS. 10(a) to 10(c) are views showing examples of the logic circuit of an integrated circuit device, respectively.
Figure 10B:
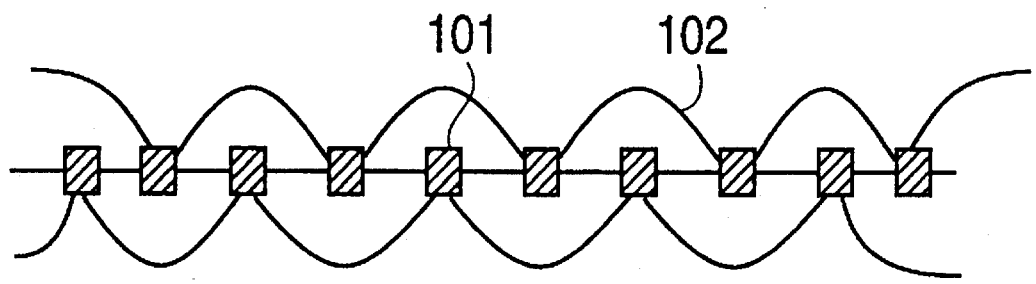
Figure 10C:
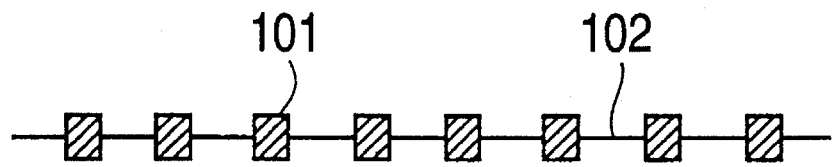

Initially, values for classifying logic circuits shown in FIGS. 10(a) to 10(c) are calculated in accordance with the flow of a process shown in FIG. 1. In FIGS. 10(a) to 10(c), cross-hatched squares represent logic elements 101 and solid lines represent lines 102 for connecting the logic elements 101 in FIGS. 10(a) to (c).

FIG. 1 illustrates the flow of data processing in a method of calculating the value for classifying logic circuits according to the present invention.

First, in Step 10 for inputting, the types of the logic elements 101 contained in the logic circuit and the wiring relationship (net list) of the lines 102 for connecting the logic elements 101 are read into an electronic calculator.

The circuit of FIG. 10(a) corresponds to a circuit of a two-dimensional cell array structure such as a multiplier, the circuit of FIG. 10(b) corresponds to a circuit of a one-dimensional cell array such as a shift register, and the circuit of FIG. 10(c) is a one-dimensional inverter chain, which corresponds to a circuit frequently observed in an oscillating circuit.

Figure 2:
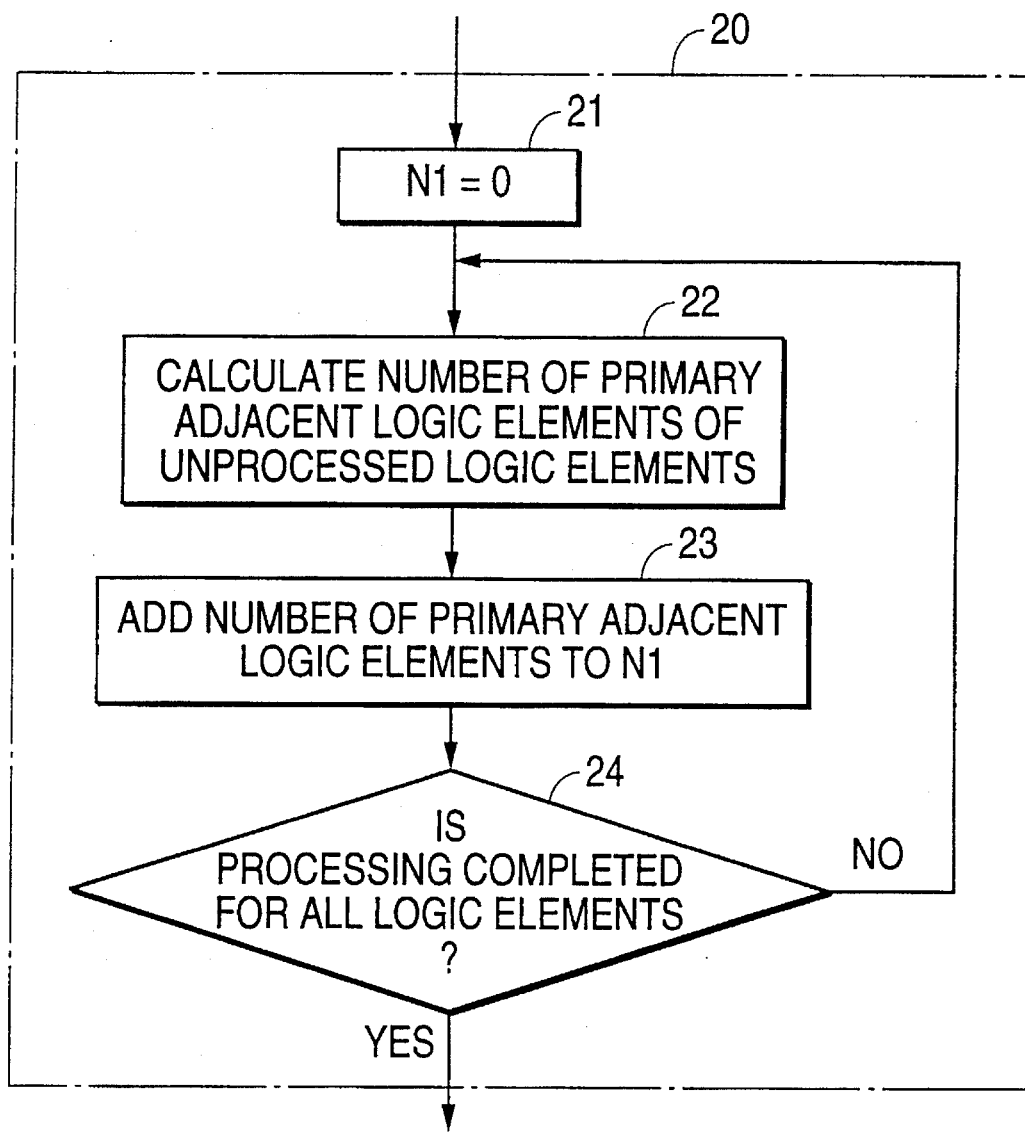
FIG. 2 is a view showing the flow of a process of obtaining the number of primary adjacent elements of all the logic elements in the method of classifying and evaluating a logic circuit mentioned above.
Figure 11A:
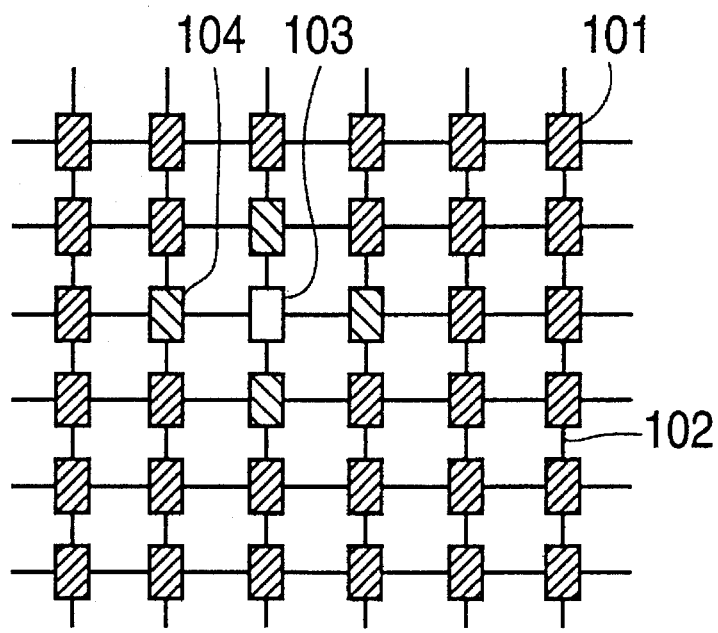
FIG. 11(a) is a view showing a group of primary adjacent elements and FIG. 11(b) is a view showing a group of primary and secondary adjacent elements.

Next, in Step 20, the total number N1 of primary adjacent elements of all the logic elements 101 is calculated. Specifically, Step 20 consists of Steps 21 to 23 shown in FIG. 2. That is, in Step 21, the total number N1 of the primary adjacent elements is initialized and reset to 0 and, in Step 22, the primary adjacent elements are calculated with respect to the unprocessed logic elements. The relationship between the logic elements and their group of primary adjacent elements, which serves as a reference, corresponds to the relationship between an element 103 represented by a blank square and a group of logic elements 104 represented by hatched squares in FIG. 11(a). Next, in Step 23, the number of the group of primary adjacent elements is added to the total number N1 of the primary adjacent elements. In order to perform the process for each of the logic elements, Step 24 is repeated as a judgment process and the processes of Steps 22 and 23 are repeated until all the logic elements are processed, thereby completing Step 20 for calculating the total number N1 of primary adjacent elements.

The total numbers N1 of primary adjacent elements in the logic circuits of FIGS. 10(a), 10(b), and 10(c) are shown in Table 1 by standardizing the number of elements to N. Table 1 also shows the net number by standardizing the number N of elements to N. To simplify the illustration, the boundary of the circuit serves as a periodic boundary condition.

TABLE 1

|           | NUMBER OF ELEMENTS | NUMBER OF LINES | N1 | N2 |
|-----------|--------------------|-----------------|----|----|
| FIG. 10 (a) | N | 2N | 4N | 2N |
| FIG. 10 (b) | N | 2N | 4N | 8N |
| FIG. 10 (c) | N | N  | 2N | 4N |

Figure 3:
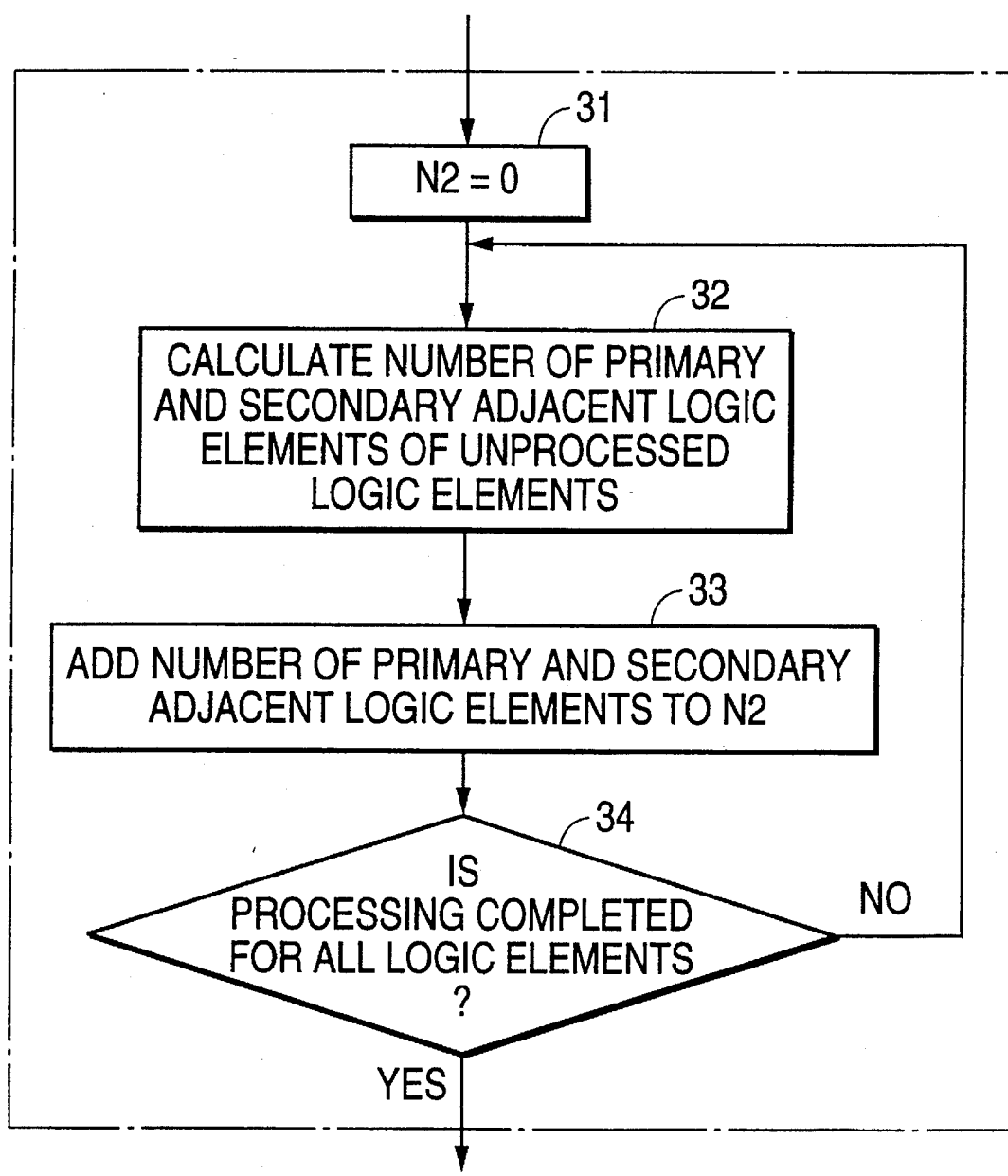
FIG. 3 is a view showing the flow of a process of obtaining the number of primary and secondary adjacent elements of all the logic elements in the method of classifying and evaluating a logic circuit mentioned above.
Figure 11B:
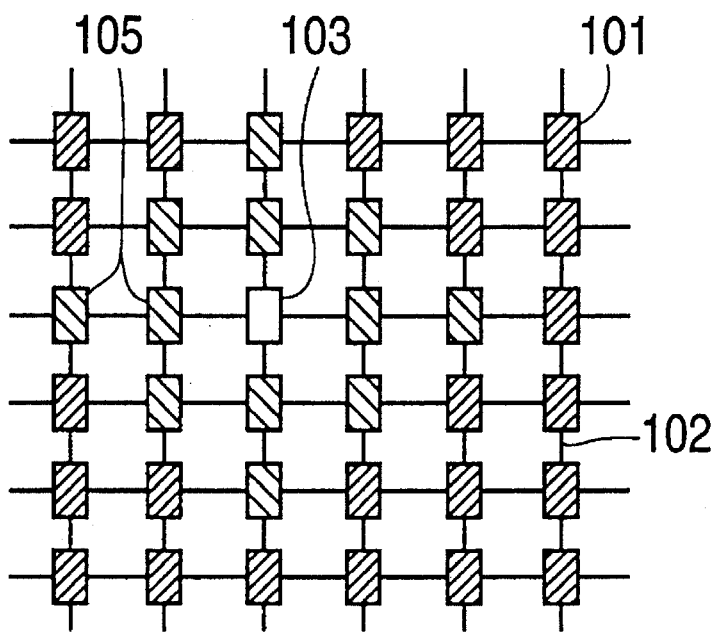

Next, in Step 30, the total number N2 of primary and secondary adjacent elements of all the logic elements 101 is calculated. Specifically, Step 30 consists of Steps 31 to 34 shown in FIG. 3. That is, in Step 31, the total number N2 of the primary and secondary adjacent elements is initialized and reset to 0, and, in Step 32, the primary and secondary adjacent elements are calculated with respect to the unprocessed logic elements. The relationship between the logic elements and the primary and secondary adjacent elements, which serves as a reference, corresponds to the relationship between an element 103 represented by a blank square and a group of logic elements 105 represented by hatched squares in FIG. 11(b). Next, in Step 33, the number of the group of primary and secondary adjacent elements is added to N2. In order to perform the process for each of the logic elements, Step 34 is repeated as a judgment process and the processes of Steps 32 and 33 are repeated until all the logic elements are processed, thereby completing Step 30 for calculating the total number N2 of primary and secondary adjacent elements.

The total numbers N2 of primary and secondary adjacent elements in the logic circuits of FIGS. 10(a), 10(b), and 10(c) are also shown in Table 1 by standardizing the number of elements to N. In Table 1, the total number N1 of primary adjacent elements is double the net number, for each line shown in the logic circuits of FIGS. 10(a) and 10(b) always connects two logic elements. In general, the total number N1 of primary adjacent elements does not coincide with the net number.

Next, in Step 40, the difference between the logarithmic value of the total number N2 of primary and secondary adjacent elements and the logarithmic value of the total number N1 of primary adjacent elements is calculated as the value $\lambda$ for classifying logic circuits. The value $\lambda$ for classification are calculated from the values in Table 1 and the results of the calculations are shown in Table 2. Here, the values $\lambda$ for classifying logic circuits are given by the following equation (15).

$$\lambda = \log(N2) - \log(N1) \qquad (15)$$

TABLE 2

|             | $\lambda$ |
|-------------|-----------|
| FIG. 10 (a) | 1.0986 |
| FIG. 10 (b) | 0.6931 |
| FIG. 10 (c) | 0.6931 |

Next, in Step 50, the $\lambda$'s in Table 2 are outputted as the values for classifying logic circuits, thereby completing the process in the method of classifying and evaluating a logic circuit according to the first embodiment.

Figure 4:
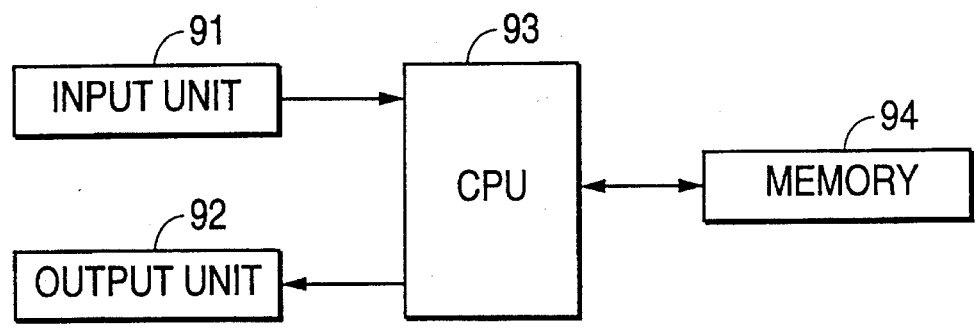
FIG. 4 is a view showing the structure of an apparatus which embodies the method of classifying and evaluating a logic circuit mentioned above.

FIG. 4 shows the structure of an apparatus which embodies the method of classifying and evaluating a logic circuit described above. The process of inputting the logic elements and net list of the logic circuit described above is performed by an input unit 91. The process of calculating the total number N1 of primary adjacent logic elements, the process of calculating the total number N2 of primary and secondary adjacent logic elements, and the process of calculating the value for classification are performed by a central processing unit 93. The output of the value $\lambda$ for classification is executed by an output unit 92. Data required for calculations and temporary storage during the processes is stored in a memory 94.

If the layout of a logic circuit is considered as the mapping of the logic circuit onto a two-dimensional plane, the connection between the logic elements in the logic circuit is most reflected in the layout.

As described above, according to the method and apparatus for classifying and evaluating a logic circuit of the first embodiment, the relationship between the logic elements and net list contained in the logic circuit is expressed based on the fractal property of the logic circuit, so that the layout of the logic circuit can be reflected precisely in the classification thereof.

EXAMPLE 2

Figure 5:
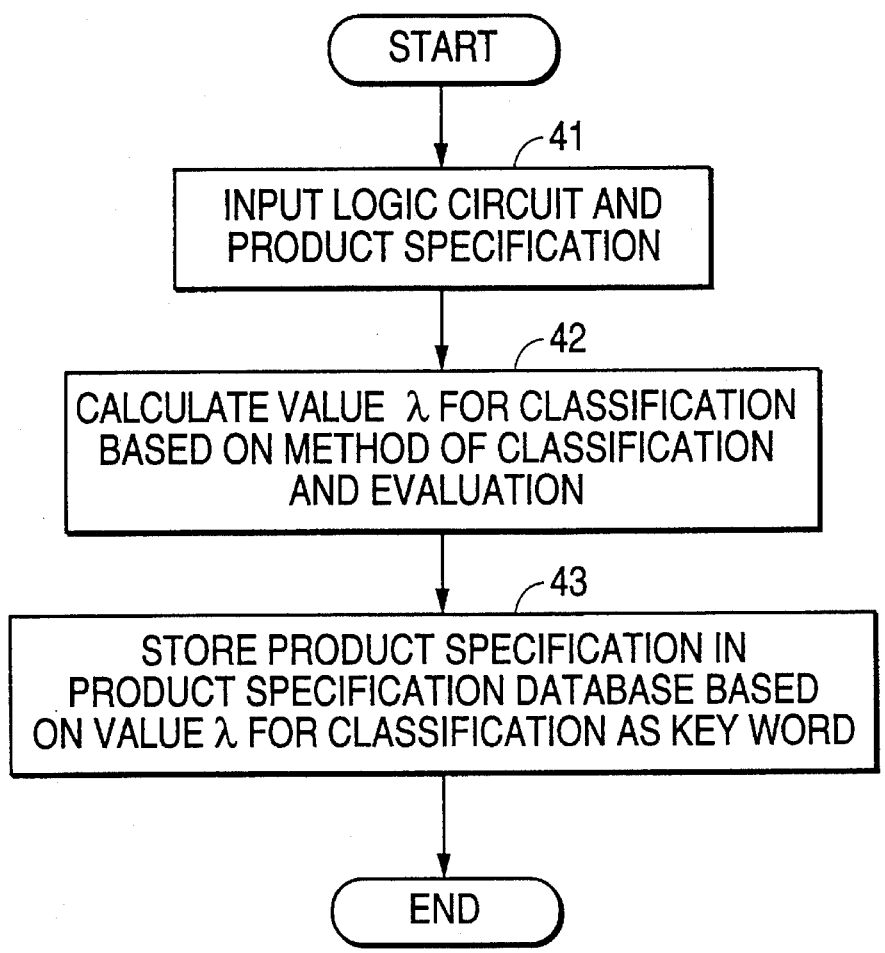
FIG. 5 is a view showing the flow of a process in a method of creating a product specification database according to a second embodiment of the present invention.
Figure 6A:
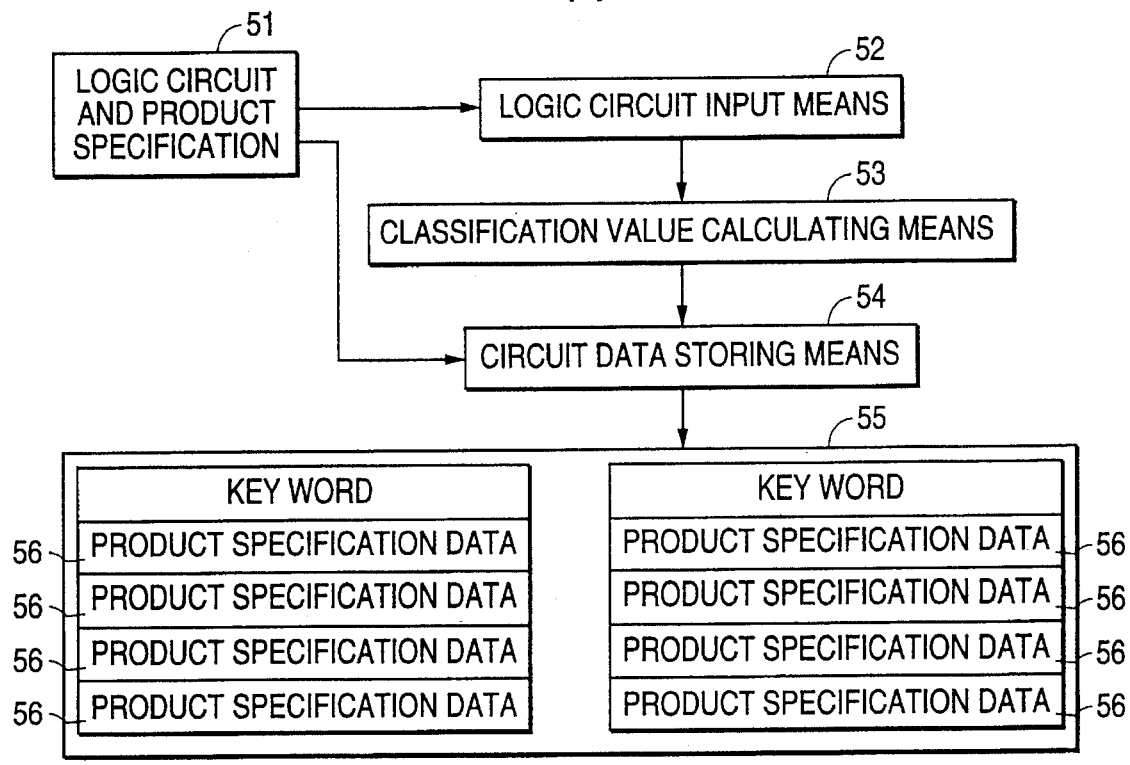
FIG. 6(a) is a view showing the structure of an apparatus for creating a product specification database according to the second embodiment of the present invention and FIG. 6(b) is a view showing the structure of product specification data in the above apparatus for creating a product specification database.
Figure 6B:
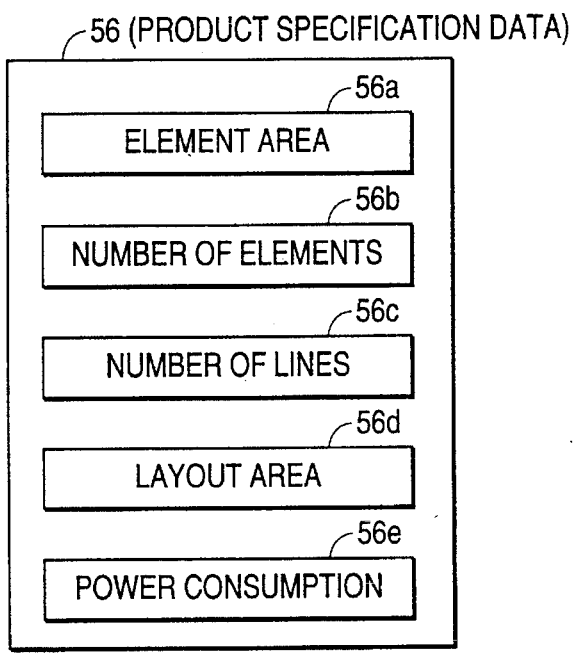

Referring now to FIG. 5 and FIGS. 6(a) and 6(b), a method of creating a product specification database according to a second embodiment of the present invention will be described below. FIG. 5 shows the flow of a process in the method of creating a product specification database. FIG. 6(a) shows the structure of an apparatus for creating a product specification database, and FIG. 6(b) shows product specification data 56 which is stored in a product specification database 55 in the apparatus for creating a product specification database.

First, in Step 41, a logic circuit and product specifications 51 of an existing LSI or printed-circuit board are read by a logic circuit input means 52. The product specifications include, e.g., the element area 56a, number of elements 56b, number of lines 56c, layout area 56d, and power consumption 56e as shown in FIG. 6(b). The logic circuit concerned here is composed of the logic elements 101 and lines 102.

Next, in Step 42, the value $\lambda$ for classifying the foregoing logic circuit is calculated by a classification value calculating means 53. The method of calculating the value $\lambda$ for classification will not be mentioned here, for it was described in the first embodiment. The value $\lambda$ for classification varies depending on logic circuits, but mostly falls into the range of 0 to 4. The values $\lambda$ for classifying two types of MCNC circuits which are often used bench marks for layout (Krzysztof Kozminski, "Benchmarks for layout synthesis-Evaluation and current status," Proceedings of 28th Design Automation Conference, pp. 265–270, June 1991) are shown in Table 3.

TABLE 3

| CIRCUIT NAME | NUMBER OF LINES | NUMBER OF ELEMENTS | $\lambda$ |
|--------------|-----------------|---------------------|-----------|
| PRIMARY1 | 985  | 833  | 2.42 |
| PRIMARY2 | 3136 | 3014 | 2.77 |
| TEST2    | 2308 | 1663 | 2.21 |
| TEST3    | 2338 | 1607 | 2.29 |
| TEST4    | 2189 | 1515 | 1.89 |
| TEST5    | 3488 | 2595 | 2.10 |
| TEST6    | 2048 | 1752 | 2.10 |
| TEST7    | 3228 | 2379 | 2.09 |

The values $\lambda$ for classifying other circuits were also calculated, but as far as obtained values are concerned, there exists no value that exceeds 4.0. Hence, if the reference values $\lambda$ for classification serving as the key words of the product specification database are set at intervals of 0.1, for example, logic circuits whose values $\lambda$ for classification fall into the same numerical range under the calibration of every 0.1 are considered to have substantially the same value λ for classification.

Next, in Step 43, a circuit data storing means 54 judges whether or not the value λ for classification, which was calculated by the classification value calculating means 53, is substantially the same as any of the key words of the product specification data 56 stored in the product specification database 55. For example, suppose the value λ =1.0986 for classifying the logic circuit of FIG. 10(*a*) is a key word λ1 and the value λ=0.6931 for classifying the logic circuits of FIGS. 10(*b*) and 10(*c*) is a key word λ2, as shown in Table 2. If the value λ for classification calculated by the classification value calculating means 53 is substantially the same as either of the key words λ1 and λ2, the product specifications are written in the product specification data 56 that has the key word judged substantially the same as the value λ for classification. If the value λ for classification is not substantially the same as any of the key words λ1 and λ2, the value λ for classification is added to the key words λ1 and λ2 as another key word under which the product specification data 56 is written. Thus, a plurality of sets of product specification data 56 are controlled under the same key word. The product specification data 56 to be written includes such items as the logic element area 56*a*, number of elements 56*b*, number of lines 56*c*, layout area 56*d*, and power consumption 56*e*, as described above. In this way, the product specification database 55 in which the product specifications are classified in greater detail can be created.

FIG. 4 shows the apparatus which embodies the method described above. In the drawing, an input unit 91 performs the process of inputting the logic circuit and product specifications described above, a CPU 93 performs the processes of calculating the total number N1 of primary adjacent logic elements, the total number N2 of primary and secondary adjacent logic elements, and the value λ for classification. Data required for calculations and temporary storage during the processes and the product specification data 56 are stored in the memory 94.

The layout of the logic circuit is reflected in the product specifications. If the layout of a logic circuit is considered as the mapping of the logic circuit onto a two-dimensional plane, the connection between the logic elements in the logic circuit is most reflected in the layout. With the method and apparatus for creating a product specification database according to the second embodiment of the present invention, the relationship between the logic elements and net list contained in the logic circuit is classified on the basis of the fractal property of the logic circuit. Consequently, the layout of the logic circuit can be reflected more precisely in the control of the product specification data.

EXAMPLE 3

Below, a method of estimating product specifications according to a third embodiment of the present invention will be described with reference to FIGS. 7 and 8. FIG. 7 shows the flow of a process in the method of estimating product specifications. FIG. 8 shows the structure of an apparatus for estimating product specifications.

First, in Step 61, a logic circuit 51 of an LSI or printed-circuit board to be manufactured is read by the logic circuit input means 52. The logic circuit 51 concerned here is composed of the logic elements 101 and lines 102 as shown in FIGS. 10(*a*) to 10(*c*).

Next, in Step 62, the value λ for classifying the logic circuit 51 is calculated by the classification value calculating means 53. The method of calculating the value λ for classification will not be mentioned here, for it was described in the first embodiment.

Next, in Step 63, a classification value comparing means 71 compares the value λ for classifying the semiconductor integrated circuit device to be manufactured, which was calculated by the classification value calculating means 53, and the key words (reference values for classification) of the product specification database 55 which was created in the second embodiment, so as to obtain the sets of product specification data 56 which are roughly similar to the value λ for classification. The key words to be compared are those which were used to classify all the sets of product specification data 56 registered in the product specification database 55 of FIG. 8.

Next, in Step 64, a product specification data extracting means 72 extracts, from among the sets of product specification data which are roughly similar to the value λ for classification, the product specification data 56 that is most similar to the value λ for classification in terms of the element area, number of elements, and number of lines.

Next, in Step 65, a size specification estimating means 73 estimates the values of the layout area 56, power consumption 56*e* and the like based on the product specification data 56 extracted by the product specification data extracting means 72.

If the layout area 56d is SO, the element area 56*a* is EO, and the power consumption 56*e* is WO in accordance with the obtained data on an existing logic circuit having the same value λ for classification, the area size factor SF and power consumption size factor F are given by the following equations:

$$SF=SO/EO.$$

$$WF=WO/EO.$$

Finally, in Step 66, a display unit 74 outputs the estimated values obtained above.

FIG. 4 shows the apparatus which embodies the method described above. The input unit 91 performs the process of inputting the logic circuit mentioned above. The CPU 93 performs the processes of calculating the total number N1 of primary adjacent logic elements, the total number N2 of primary and secondary adjacent logic elements, and the value λ for classification. The CPU 93 further performs the processes of comparing the classification value and key words and of extracting the product specification data. The output unit 92 outputs the estimated value of size specification. Data required for calculations and temporary storage during the processes and the product specification data 56 are stored in the memory 94.

The layout of a logic circuit is reflected in the product specifications. If the layout of a logic circuit is considered as the mapping of the logic circuit onto a two-dimensional plane, the connection between the logic elements in the logic circuit is most reflected in the layout. With the method and apparatus for estimating product specifications according to the third embodiment of the present invention, not only the relationship between the logic elements and net list of a logic circuit is classified on the basis of the fractal property of the logic circuit, but also the product specification data is extracted from the product specification database in which sets of product specification data are similarly classified. Consequently, the logic circuit can be estimated with high precision.

EXAMPLE 4

Figure 9:
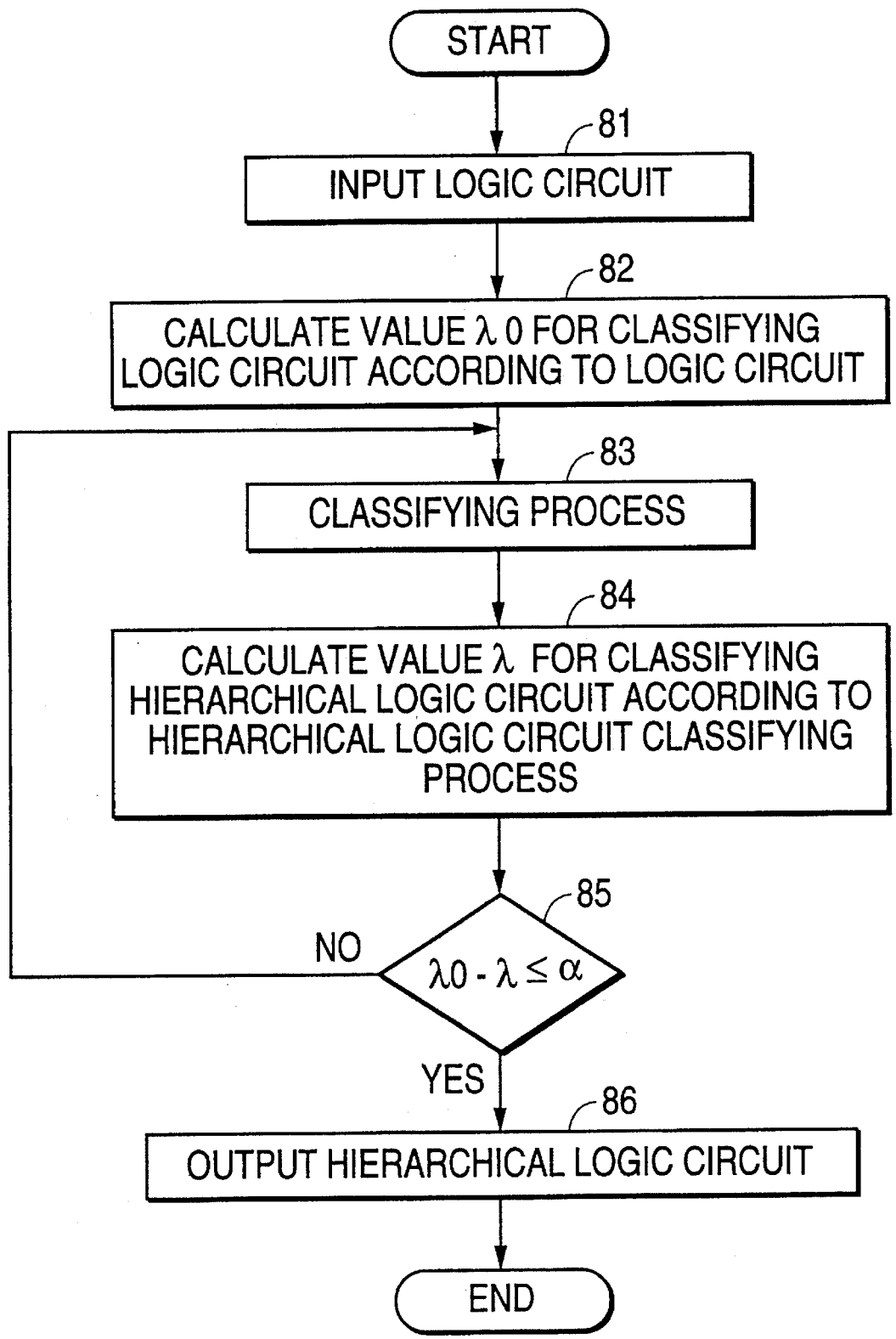
FIG. 9 is a view showing the flow of a process in a method of automatically organizing a logic circuit in a hierarchical structure according to a fourth embodiment of the present invention.

Below, a method of automatically organizing a logic circuit in a hierarchical structure according to a fourth embodiment of the present invention will be described with reference to FIG. 9. FIG. 9 shows the flow of a process in the method of automatically organizing logic circuits in a hierarchical structure.

First, a logic circuit of an LSI or printed-circuit board is read in Step 81. The logic circuit concerned here is composed of the logic elements 101 and lines 102 of FIGS. 10(*a*) to 10(*c*).

Next, in Step 82, a first value λ0 for classifying the foregoing logic circuit is calculated. The method of calculating the first value λ0 for classification will not be mentioned here, for it was described in the first embodiment.

Next, in Step 83, the logic circuit is subjected to a process of hierarchical organization, so as to create a hierarchical logic circuit. Specifically, the first process of hierarchical organization can be exemplified by a simple process of extracting two adjacent elements which are connected in a given net list.

Next, in Step 84, a second value λ for classifying the hierarchical logic circuit is calculated in the same manner as in the first embodiment.

Next, in Step 85, it is judged whether the difference between the second value λ for classification and the first value λ0 for classification is larger than a variation permissible rate α or not. If the difference between the first value λ0 for classification and the second value for classification is not greater than the variation permissible rate α, the process of hierarchical organization is completed so that the hierarchical logic circuit is outputted in Step 86.

If the difference between the first value λ0 for classification and the second value λ for classification is less than the variation permissible rate α, the process returns to Step 83 in which the hierarchical logic circuit is further subjected to the process of hierarchical organization so as to create a high-level hierarchical logic circuit. Since the variation permissible rate α mentioned above is experimentally determined based on the relationships between λ and λ0 which realize the optimum layout process, a layout process is performed in each of the processes of hierarchically organizing a variety of logic circuits so as to obtain the relationships between λ and λ0 which realize the optimum layout process.

FIG. 4 shows the apparatus which embodies the method. The input unit 91 performs the process of inputting the logic circuit. The CPU 93 performs the processes of calculating the total number N1 of primary adjacent logic elements, the total number N2 of primary and secondary adjacent logic elements, and the values λ0 and λ. The output unit 92 outputs the hierarchical logic circuit. Data required for calculations and temporary storage during the processes are stored in the memory 94.

According to the method and apparatus for automatically organizing a logic circuit in a hierarchical structure, a high-level hierarchical logic circuit can automatically be created without obtaining the fractal property of the logic circuit, so that the original property of the logic circuit is reflected in any CAD process. Moreover, since the process of hierarchical organization has the effect of reducing the number of the logic elements to be processed, the processing time can also be reduced without deteriorating the quality of the process of hierarchical organization, thus solving the problem of lengthy time required by CAD for processing an extremely large logic circuit.

Although the above embodiments used specific logic circuits, it will be understood that the present invention is also effective even when logic circuit data of an ordinary semiconductor integrated circuit device, logic circuit data of an ordinary printed-circuit board, or block logic circuit data of a high-level hierarchical logic design is inputted as the logic circuit instead.

Although the value λ for classification is calculated by using the total number N1 of primary adjacent elements and the total number N2 of primary and secondary adjacent elements, it will be understood that the number of a higher-order adjacent elements can also be used extensively in order to practice the same method as described above without departing from the scope of the present invention.

We claim:

1. A method for an electronic calculator to classify and evaluate a logic circuit based on a value for classification which characterizes said logic circuit, said value for classification being calculated from logic elements and net list contained in the logic circuit, comprising the steps of:

inputting to the electronic calculator the logic elements and net list contained in the logic circuit;

calculating, from the inputted logic elements and net list, a total number N1 of primary adjacent logic elements that are connected directly to all the logic elements contained in said logic circuit, respectively;

calculating, from the inputted logic elements and net list, a total number N2 of primary and secondary adjacent logic elements, which is a sum of N1 and the total number of secondary adjacent logic elements that are connected directly to said primary adjacent logic elements, respectively; and calculating, as said value for classification which characterizes said logic circuit, a difference between a logarithmic value of N2 and a logarithmic value of N1.

2. The method for an electrical calculator to classify and evaluate a logic circuit according to claim 1, wherein said step of calculating the total number N1 of primary adjacent logic elements further comprises:

individually calculating the number of primary adjacent logic elements that are connected directly to a logic element via lines contained in said logic circuit for each of the logic elements contained in said logic circuit and obtaining the total number of primary adjacent logic elements of all the logic elements, and said step of calculating the total number N2 of primary and secondary adjacent logic elements further comprises:

individually calculating the number of secondary adjacent logic elements that are connected directly to a primary adjacent logic element via lines for each of the primary adjacent logic elements contained in said logic circuit and obtaining the total number of secondary adjacent logic elements of all the primary adjacent logic elements, and summing N1 and the total number of secondary adjacent logic elements of all the primary adjacent logic elements.

3. A method for an electronic calculator to create a product specification database for an existing integrated circuit device based on a value for classification which characterizes a logic circuit of the existing integrated circuit device, said value for classification being calculated from logic elements and net list contained in the logic circuit of the existing integrated circuit device, comprising the steps of:

inputting to the electronic calculator the logic elements and net list contained in the logic circuit of the existing integrated circuit device;

calculating, from the inputted logic elements and net list, a total number N1 of primary adjacent logic elements that are connected directly to all the logic elements contained in said logic circuit, respectively;

calculating, from the inputted logic elements and net list, a total number N2 of primary and secondary adjacent logic elements, which is a sum of N1 and the total number of secondary adjacent logic elements that are directly connected to the primary adjacent logic elements, respectively;

calculating, as said value for classification which characterizes said logic circuit, the difference between the logarithmic value of N2 and the logarithmic value of N1; and creating a product specification database in which product specification of said existing integrated circuit device is classified by using, as a key word, the calculated value for classification.

4. A method for an electronic calculator to estimate product specifications of an integrated circuit device to be manufactured, based on a value for classification which characterizes a logic circuit of the integrated circuit device to be manufactured, said value for classification being calculated from logic elements and net list contained in the logic circuit of the integrated circuit device, comprising the steps of:

inputting to the electronic calculator the logic elements and net list contained in the logic circuit of the integrated circuit device to be manufactured;

calculating, from the inputted logic elements and net list, a total number N1 of primary adjacent logic elements that are connected directly to all the logic elements contained in said logic circuit, respectively;

calculating, from the inputted logic elements and net list, a total number N2 of primary and secondary adjacent logic elements, which is a sum of N1 and the total number of secondary adjacent logic elements that are connected directly to the primary adjacent logic elements, respectively;

calculating, as said value for classification which characterizes said logic circuit, a difference between a logarithmic value of N2 and a logarithmic value of N1;

extracting, from a product specification database containing product specifications for existing integrated circuit devices, product specifications of an existing integrated circuit device having a value for classification equal to the calculated value for classification of the integrated circuit device to be manufactured;

estimating the product specifications of the integrated circuit device to be manufactured on the basis of the extracted product specifications of the existing integrated circuit device; and outputting the estimated product specifications of the integrated circuit device to be manufactured.

5. A method for an electronic calculator to automatically organize a logic circuit in a hierarchical structure to design a hierarchical logic circuit based on logic elements and net list contained in the logic circuit, comprising the steps of:

(a) inputting to the electronic calculator the logic elements and net list contained in the logic circuit;

(b) calculating, from the inputted logic elements and net list, a total number N1 of primary adjacent logic elements that are connected directly to all the logic elements contained in said logic circuit, respectively;

(c) calculating, from the inputted logic elements and net list, a total number N2 of primary and secondary adjacent logic elements, which is a sum of N1 and the total number of secondary adjacent logic elements that are connected directly to the primary adjacent logic elements, respectively;

(d) calculating, as a first value for classification that characterizes said logic circuit, a difference between a logarithmic value of N2 and a logarithmic value of N1;

(e) designing a hierarchical logic circuit for said logic circuit based on the inputted logic elements and net list of said logic circuit;

(f) calculating, from logic elements and net list contained in said hierarchical logic circuit designed in step (e), the total number $N1_H$ of primary adjacent logic elements that are connected directly to all the logic elements contained in said hierarchical logic circuit, respectively;

(g) calculating, from the logic elements and net list contained in said hierarchical logic circuit designed in step (e), the total number $N2_H$ of primary and secondary adjacent logic elements, which is a sum of $N1_H$ and the total number of secondary adjacent logic elements that are connected directly to all the primary adjacent logic elements in said hierarchical logic circuit respectively;

(h) calculating, as a second value for classification that characterizes said hierarchical logic circuit, a difference between a logarithmic value of $N2_H$ and a logarithmic value of $N1_H$;

(i) judging whether a difference between said first value for classification and said second value for classification falls within a predetermined permissible range or not, wherein the hierarchical designing is complete if the difference between said first value for classification and said second value for classification is permissible and continuing the hierarchical designing from step (e) if the difference between said first value for classification and said second value for classification is not permissible.

6. An electronic calculator for classifying and evaluating a logic circuit based on a value for classification which characterizes said logic circuit, said value for classification being calculated from logic elements and net list contained in the logic circuit, comprising:

means for inputting to the electronic calculator the logic elements and net list contained in the logic circuit;

means for calculating, from the inputted logic elements and net list, a total number N1 of primary adjacent logic elements that are connected directly to all the logic elements contained in said logic circuit, respectively;

means for calculating, from the inputted logic elements and net list, a total number N2 of primary and secondary adjacent logic elements, which is a sum of N1 and the total number of secondary adjacent logic elements that are connected directly to said primary adjacent logic elements, respectively; and means for calculating, as said value for classification which characterizes said logic circuit, a difference between a logarithmic value of N2 and a logarithmic value of N1.

7. The electronic calculator for classifying and evaluating a logic circuit according to claim 6, wherein said means for calculating calculates the total number N1 of primary adjacent logic elements by individually calculating the number of primary adjacent logic elements that are connected directly to a logic element via lines contained in said logic circuit for each of the logic elements contained in said logic circuit and obtaining the total number of primary adjacent logic elements of all the logic elements, and said means for calculating calculates the total number N2 of primary and secondary adjacent logic elements by individually calculating the number of secondary adjacent logic elements that are connected directly to a primary adjacent logic element via lines for each of the primary adjacent logic elements contained in said logic circuit and obtaining the total number of secondary adjacent logic elements of all the primary adjacent logic elements, and summing N1 and the total number of secondary adjacent logic elements of all the primary adjacent logic elements.

8. An electronic calculator for creating a product specification database for an existing integrated circuit device based on a value for classification which characterizes a logic circuit of the existing integrated circuit device, said value for classification being calculated from logic elements and net list contained in a logic circuit of the existing integrated circuit device, comprising:

means for inputting the logic elements and net list contained in the logic circuit of the existing integrated circuit device;

means for calculating, from the inputted logic elements and net list, a total number N1 of primary adjacent logic elements that are connected directly to all the logic elements contained in said logic circuit, respectively;

means for calculating, from the inputted logic elements and net list, a total number N2 of primary and secondary adjacent logic elements, which is a sum of N1 and the total number of secondary adjacent logic elements that are directly connected to the primary adjacent logic elements, respectively;

means for calculating, as said value for classification which characterizes said logic circuit, a difference between a logarithmic value of N2 and a logarithmic value of N1; and means for creating a product specification database in which product specification of said existing integrated circuit device is classified by using, as a key word, the calculated value for classification.

9. An electronic calculator for estimating product specifications of an integrated circuit device to be manufactured based on a value for classification which characterizes a logic circuit of the integrated circuit device to be manufactured, said value for classification being calculated from logic elements and net list contained in the logic circuit of the integrated circuit device, comprising:

means for inputting to the electronic calculator the logic elements and net list contained in the logic circuit of the integrated circuit device to be manufactured;

means for calculating, from the inputted logic elements and net list, a total number N1 of primary adjacent logic elements that are connected directly to all the logic elements contained in said logic circuit, respectively;

means for calculating, from the inputted logic elements and net list, a total number N2 of primary and secondary adjacent logic elements, which is a sum of N1 and the total number of secondary adjacent logic elements that are connected directly to said primary adjacent logic elements, respectively; and means for calculating, as said value for classification which characterizes said logic circuit, a difference between a logarithmic value of N2 and a logarithmic value of N1;

means for extracting, from a product specification database containing product specifications for existing integrated circuit devices product specifications of an existing integrated circuit device having a value for classification equal to the calculated value for classifying the integrated circuit device to be manufactured;

means for estimating the product specifications of the integrated circuit device to be manufactured on the basis of the extracted product specifications of the existing integrated circuit device; and means for outputting the estimated product specifications of the integrated circuit device to be manufactured.

10. An electronic calculator for automatically organizing a logic circuit in a hierarchical structure to design a hierarchical logic circuit based on logic elements and net list contained in the logic circuit, comprising:

means for inputting to the electronic calculator the logic elements and net list contained in the logic circuit;

means for calculating, from the inputted logic elements and net list, a total number N1 of primary adjacent logic elements that are connected directly to all the logic elements contained in said logic circuit, respectively;

means for calculating, from the inputted logic elements and net list, a total number N2 of primary and secondary adjacent logic elements, which is a sum of N1 and the total number of secondary adjacent logic elements that are connected directly to the primary adjacent logic elements, respectively;

means for calculating, as a first value for classification that characterizes said logic circuit, a difference between a logarithmic value of N2 and a logarithmic value of N1;

means for designing a hierarchical logic circuit for said logic circuit based on the inputted logic elements and net list of said logic circuit;

means for calculating, from the logic elements and net list contained in said hierarchical logic circuit, the total number $N1_H$ of primary adjacent logic elements that are connected directly to all the logic elements contained in said hierarchical logic circuit, respectively;

means for calculating, from the logic elements and net list contained in said hierarchical logic circuit, the total number $N2_H$ of primary and secondary adjacent logic elements, which is a sum of $N1_H$ and the total number of secondary adjacent logic elements that are connected directly to all the primary adjacent logic elements in said hierarchical logic circuit, respectively;

means for calculating, as a second value for classification that characterizes said hierarchical logic circuit, a difference between a logarithmic value of $N2_H$ and a logarithmic value of $N1_H$;

means for judging whether the difference between said first value for classification and said second value for classification falls within a predetermined permissible range or not, wherein the hierarchical designing is complete if the difference between said first value for classification and said second value for classification is permissible and the hierarchical designing continues if the difference between said first value for classification and said second value for classification is not permissible.

* * * * *